United States Patent
Curlee et al.

(10) Patent No.: US 11,388,836 B2
(45) Date of Patent: Jul. 12, 2022

(54) PLASTIC TOTE

(71) Applicant: Dell Products L.P., Round Rock, TX (US)

(72) Inventors: James Don Curlee, Round Rock, TX (US); Steven Embleton, Austin, TX (US); Joshua Scott Keup, Austin, TX (US); Ben John Sy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 70 days.

(21) Appl. No.: 16/743,280

(22) Filed: Jan. 15, 2020

(65) Prior Publication Data

US 2021/0219453 A1 Jul. 15, 2021

(51) Int. Cl.
*H05K 7/18* (2006.01)
*H05K 5/03* (2006.01)
*H05K 5/02* (2006.01)

(52) U.S. Cl.
CPC ........... *H05K 7/183* (2013.01); *H05K 5/0234* (2013.01); *H05K 5/03* (2013.01)

(58) Field of Classification Search
CPC ......... H05K 7/183; H05K 5/0234; H05K 5/03
See application file for complete search history.

(56) References Cited

U.S. PATENT DOCUMENTS

| | | | |
|---|---|---|---|
| 4,728,160 A | | 3/1988 | Mondor et al. |
| 5,298,681 A | * | 3/1994 | Swift ...................... H02B 1/01 174/97 |
| 5,897,180 A | * | 4/1999 | Singer ...................... F16B 12/26 312/265.3 |
| 6,439,528 B1 | * | 8/2002 | Goto ........................ F16M 11/22 211/43 |
| 7,304,855 B1 | * | 12/2007 | Milligan .............. G11B 33/128 361/724 |
| 7,551,971 B2 | | 6/2009 | Hillis |
| 7,556,271 B2 | * | 7/2009 | Robbins ................. H05K 7/183 280/47.34 |
| 7,854,652 B2 | * | 12/2010 | Yates ......................... F16F 7/14 454/184 |
| 8,490,413 B2 | * | 7/2013 | Blackway ................ F25B 21/02 62/3.62 |
| 9,423,001 B2 | | 8/2016 | Green et al. |
| 9,701,330 B2 | | 7/2017 | Mkandawire et al. |
| 9,732,979 B2 | | 8/2017 | Fadell et al. |

(Continued)

OTHER PUBLICATIONS

Affordable Display Products, Wood Chart File Wall Rack with 4 Pockets, https://www.affordabledisplayproducts.com/Display-Products/Medical-Chart-File-Flolders-Hanging-File-Folder-Racks-Medical-Chart-Holders/CH14-2-Chart-File-Wall-Rack-Wood.

(Continued)

*Primary Examiner* — Hanh V Tran
(74) *Attorney, Agent, or Firm* — Jackson Walker L.L.P.

(57) ABSTRACT

An apparatus may include a plastic frame; a plurality of mounting features coupled to the plastic frame such that the plastic frame is configured to maintain the plurality of mounting features in a desired orientation, wherein the plurality of mounting features, when in the desired orientation, are operable to receive and retain information handling systems; and a base coupled to the plastic frame and disposed below the plastic frame along a central vertical axis of the apparatus that is defined by the orientation of the plurality of mounting features.

17 Claims, 7 Drawing Sheets

(56) References Cited

U.S. PATENT DOCUMENTS

| | | | |
|---|---|---|---|
| 9,992,913 B1 | 6/2018 | Czamara et al. | |
| 10,093,450 B2* | 10/2018 | Embleton | B65D 81/02 |
| 10,334,749 B2* | 6/2019 | Eckberg | B60B 33/0078 |
| 10,850,757 B1* | 12/2020 | Curlee | B62B 3/004 |
| 2003/0041409 A1 | 3/2003 | Caporale | |
| 2006/0243690 A1* | 11/2006 | Mollard | H05K 5/02 |
| | | | 211/151 |
| 2006/0288659 A1* | 12/2006 | Scheid | B65D 5/509 |
| | | | 53/396 |
| 2010/0243586 A1* | 9/2010 | Henderson | H05K 7/1489 |
| | | | 211/26.2 |
| 2011/0149508 A1* | 6/2011 | Malekmadani | H05K 7/1489 |
| | | | 361/679.48 |
| 2011/0279973 A1* | 11/2011 | Terwilliger | H05K 7/1489 |
| | | | 361/679.58 |
| 2012/0104917 A1 | 5/2012 | Fan | |
| 2012/0273438 A1* | 11/2012 | Nordin | H05K 7/1491 |
| | | | 211/26 |
| 2013/0032310 A1* | 2/2013 | Jaena | F28D 15/02 |
| | | | 165/104.25 |
| 2015/0173253 A1* | 6/2015 | Lewis, II | H05K 7/20754 |
| | | | 312/223.2 |
| 2015/0186840 A1 | 7/2015 | Torres et al. | |
| 2015/0334866 A1* | 11/2015 | Bailey | H05K 7/183 |
| | | | 312/223.2 |
| 2016/0073547 A1* | 3/2016 | Maloney | H05K 7/183 |
| | | | 211/26 |
| 2016/0107793 A1* | 4/2016 | Jiang | B65D 81/022 |
| | | | 206/599 |
| 2016/0221716 A1* | 8/2016 | Embleton | B65D 81/02 |
| 2017/0223864 A1* | 8/2017 | Jost | H05K 7/1401 |
| 2017/0257969 A1* | 9/2017 | Kuan | E05C 3/042 |
| 2017/0273212 A1* | 9/2017 | Davis | H05K 7/1488 |
| 2017/0290193 A1* | 10/2017 | Franklin | H05K 7/1495 |
| 2018/0126896 A1* | 5/2018 | Embleton | B62D 33/0207 |
| 2018/0127147 A1 | 5/2018 | Embleton et al. | |
| 2019/0132976 A1* | 5/2019 | Clements | B65D 19/385 |

OTHER PUBLICATIONS

Caster Concepts, 5 Industries Where Shock Absorbing Caster Wheels are Perfect, Aug. 8, 2018, https://www.casterconcepts.com/industries-shock-absorbing-caster-wheels.

Crenlo, Emcor Defender Air Conditioned Server Rack Cabinets, https://www.crenlo.com/emcor/enclosures/datacom/server-cabinets/defender/.

Fernandez-Carames, Tiago M. and Fraga-Lamas, Paula, A Review on Human-Centered IoT-Connected Smart Labels for the Industry 4.0, May 7, 2018, IEEE Access, Special Section on Human-Centered Smart Systems and Technologies, vol. 6, 2018, p. 25939-25957.

18U Open Frame 2 Post Server IT Network Data Rack HQ Relay on Casters Sysracks, https://www.amazon.com/Frame-Server-Network-Casters-Sysracks/dp/B079M19BXD.

Pelican-Hardigg Rack Mount Cases, https://www.pelican.com/us/en/professional/rack-mount-cases/.

RackLift RL5000E | 5000LB Server Cabinet Lifter, https://racklift.com/datacenter-products/racklift-rl5000e/.

ServerLift SL-500X Electric Lift, https://serverlift.com/data-center-lifts/sl-500x/.

Starcase, Elastomeric Isolation Mounts, https://www.starcase.com/Articles.asp?ID=256.

StepLift Ltd., Steplift's Server Management System, https://web.archive.org/web/20180428135226/https://www.steplift.com/server-management-system/.

* cited by examiner

PLASTIC TOTE

This application is related to U.S. application Ser. No. 16/681,336, filed Nov. 12, 2019 (now U.S. Pat. No. 10,850,757, issued on Dec. 1, 2020), which is incorporated by reference herein in its entirety. That application discusses in detail various embodiments of shippable "totes" that may be used as an all-in-one solution to dampen shock events via shock absorbers and/or isolators fully integrated into a server rack.

TECHNICAL FIELD

The present disclosure relates in general to information handling systems, and more particularly to transportation of information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Various problems are known in the field of transportation and delivery of information handling systems, particularly in the enterprise context of rack-mounted systems including a plurality of standard-sized server information handling systems. Currently, integrated rack solutions are typically delivered to customers on a wooden pallet with foam (e.g., extruded polystyrene foam) to mitigate shock events. The shipping environment is extremely harsh, and integrated rack solutions can see significant forces, causing damage to the rack or the internal equipment. Further, existing solutions tend to involve large quantities of single-use packing and shipping materials that must be discarded after delivery.

The present application addresses more specifically ways of constructing some embodiments of such totes. For example, existing rack solutions for transporting information handling systems are typically made of metal such as steel. Steel solutions are quite heavy, however, and so they may increase the expense of transportation. They may also be less convenient to move around within a data center, etc. Additionally, all-metal construction may tend to transmit shocks and vibrations directly into the internal equipment.

Steel is typically used because of its strength. Even in relatively thin sheet metal, steel construction provides enough strength to allow existing rack solutions to meet width constraints.

For totes that are used primarily for transportation, however, data center width constraints may be relaxed somewhat. Additionally, the need to have a flat (vertical) exterior may also be less important in a transportation tote than it is in the data center. Accordingly, it may be possible to construct totes according to the present disclosure using plastics for certain portions of the construction. Such plastics may reduce weight, reduce construction costs, dampen shocks and vibrations, and provide other benefits.

For example, thermoplastics may be used, such as acrylonitrile butadiene styrene (ABS), high-density polyethylene (HDPE), polycarbonate, polyamide (nylon), polystyrene, polypropylene, etc. In some embodiments, reinforced plastics (e.g., reinforced with calcium carbonate, glass fiber, glass beads, etc.) may also be used. In various embodiments, such plastics may be injection-molded, roto-molded, blow-molded, formed from plastic sheets, or formed in any other suitable manner.

It should also be noted that the discussion of a technique in the Background section of this disclosure does not constitute an admission of prior-art status. No such admissions are made herein, unless clearly and unambiguously identified as such.

SUMMARY

In accordance with the teachings of the present disclosure, the disadvantages and problems associated with transportation of information handling systems may be reduced or eliminated.

In accordance with embodiments of the present disclosure, an apparatus may include a plastic frame; a plurality of mounting features coupled to the plastic frame such that the plastic frame is configured to maintain the plurality of mounting features in a desired orientation, wherein the plurality of mounting features, when in the desired orientation, are operable to receive and retain information handling systems; and a base coupled to the plastic frame and disposed below the plastic frame along a central vertical axis of the apparatus that is defined by the orientation of the plurality of mounting features.

In accordance with these and other embodiments of the present disclosure, a method may include forming a plastic frame of an apparatus; coupling a plurality of mounting features to the plastic frame such that the plastic frame is configured to maintain the plurality of mounting features in a desired orientation, wherein the plurality of mounting features, when in the desired orientation, are operable to receive and retain information handling systems; and coupling a base to the plastic frame below the plastic frame along a central vertical axis of the apparatus that is defined by the orientation of the plurality of mounting features.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
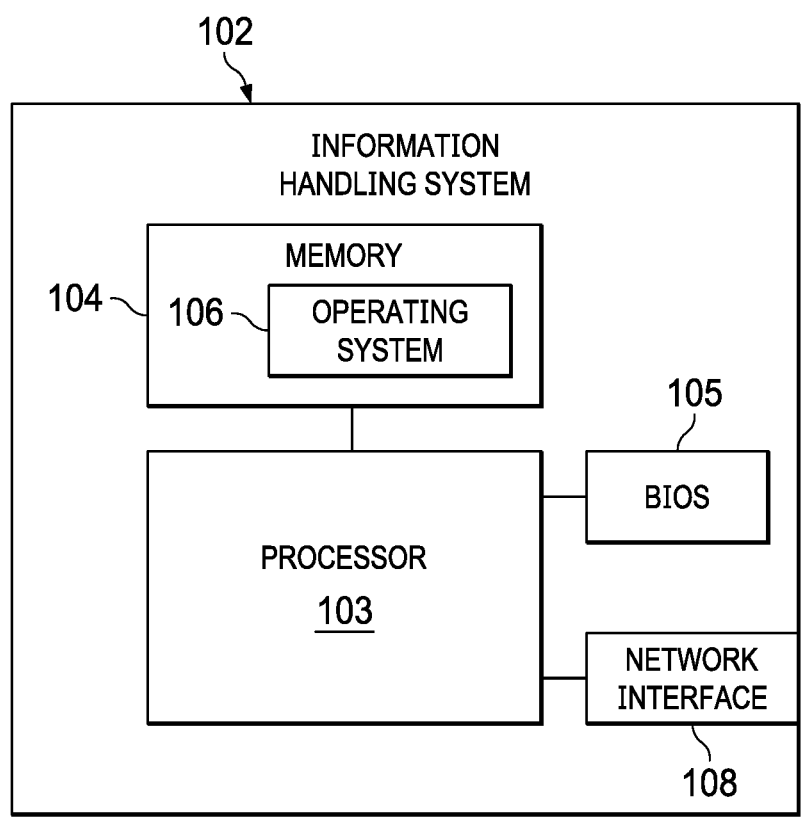
FIG. 1 illustrates a block diagram of an example information handling system, in accordance with embodiments of the present disclosure.

Preferred embodiments and their advantages are best understood by reference to FIGS. 1 through 3C, wherein like numbers are used to indicate like and corresponding parts.

For the purposes of this disclosure, the term "information handling system" may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For purposes of this disclosure, when two or more elements are referred to as "coupled" to one another, such term indicates that such two or more elements are in electronic communication or mechanical communication, as applicable, whether connected directly or indirectly, with or without intervening elements.

When two or more elements are referred to as "coupleable" to one another, such term indicates that they are capable of being coupled together.

For the purposes of this disclosure, the term "computer-readable medium" (e.g., transitory or non-transitory computer-readable medium) may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; communications media such as wires, optical fibers, microwaves, radio waves, and other electromagnetic and/or optical carriers; and/or any combination of the foregoing.

For the purposes of this disclosure, the term "information handling resource" may broadly refer to any component system, device, or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data (which may generally be referred to as "physical storage resources"). As shown in FIG. 1, information handling system 102 may comprise a processor 103, a memory 104 communicatively coupled to processor 103, a BIOS 105 (e.g., a UEFI BIOS) communicatively coupled to processor 103, a network interface 108 communicatively coupled to processor 103. In addition to the elements explicitly shown and described, information handling system 102 may include one or more other information handling resources.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may include any system, device, or apparatus configured to retain program instructions and/or data for a period of time (e.g., computer-readable media). Memory 104 may include RAM, EEPROM, a PCMCIA card, flash memory, magnetic storage, opto-magnetic storage, or any suitable selection and/or array of volatile or non-volatile memory that retains data after power to information handling system 102 is turned off.

As shown in FIG. 1, memory 104 may have stored thereon an operating system 106. Operating system 106 may comprise any program of executable instructions (or aggregation of programs of executable instructions) configured to manage and/or control the allocation and usage of hardware resources such as memory, processor time, disk space, and input and output devices, and provide an interface between such hardware resources and application programs hosted by operating system 106. In addition, operating system 106 may include all or a portion of a network stack for network communication via a network interface (e.g., network interface 108 for communication over a data network). Although operating system 106 is shown in FIG. 1 as stored in memory 104, in some embodiments operating system 106 may be stored in storage media accessible to processor 103, and active portions of operating system 106 may be transferred from such storage media to memory 104 for execution by processor 103.

Network interface 108 may comprise one or more suitable systems, apparatuses, or devices operable to serve as an interface between information handling system 102 and one or more other information handling systems via an in-band network. Network interface 108 may enable information handling system 102 to communicate using any suitable transmission protocol and/or standard. In these and other embodiments, network interface 108 may comprise a network interface card, or "NIC." In these and other embodiments, network interface 108 may be enabled as a local area network (LAN)-on-motherboard (LOM) card.

As discussed above, various problems are known in the art of transportation and delivery of information handling systems (e.g., information handling system 102). Accordingly, a transportation apparatus referred to herein as a tote may be used as an all-in-one solution that dampens shock events via shock absorbers and/or isolators fully integrated into a server rack, having a ship loadable design.

Figure 2A:
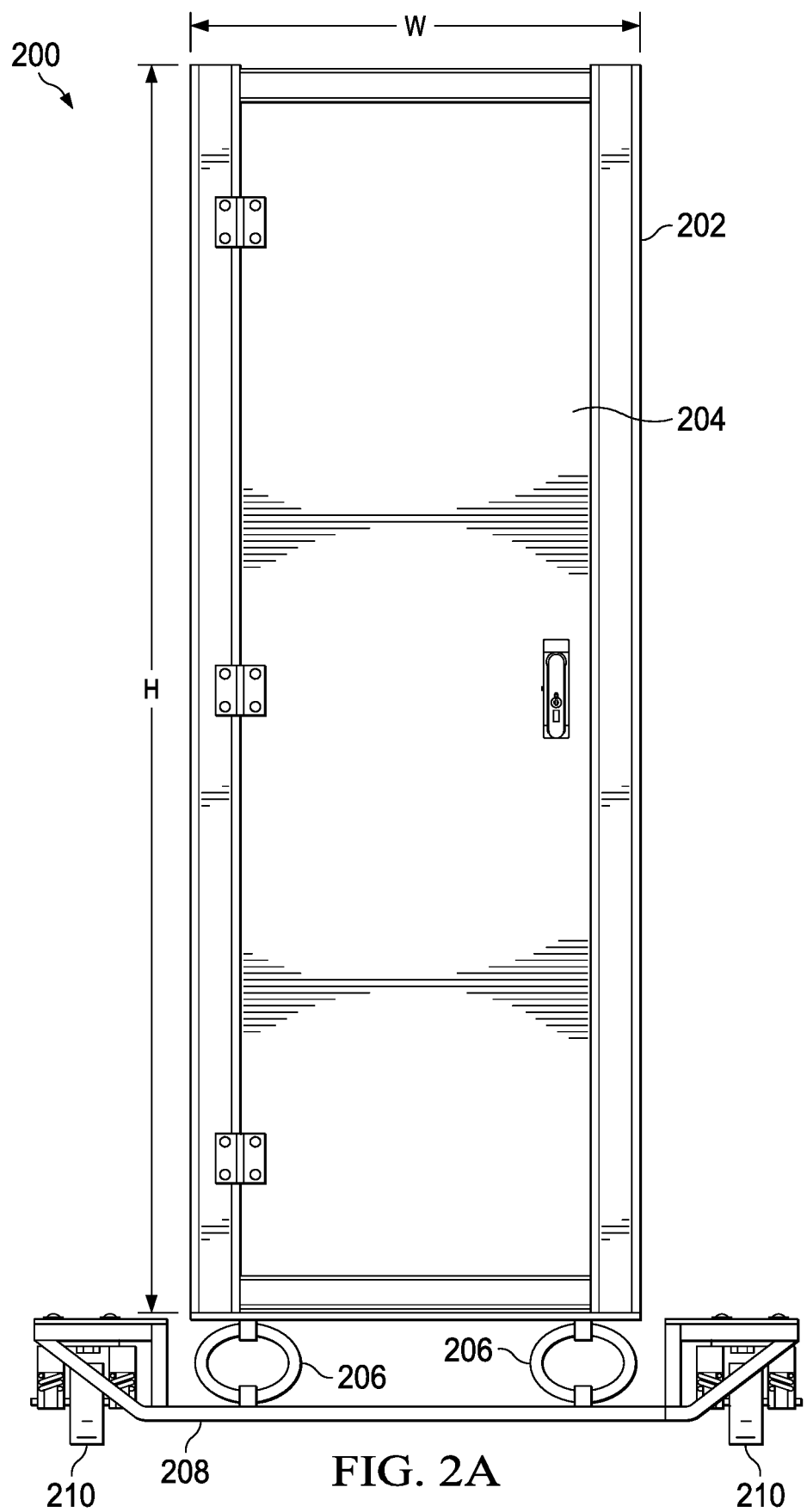
FIG. 2A illustrates a front view of an example transportation apparatus, in accordance with embodiments of the present disclosure.
Figure 2B:
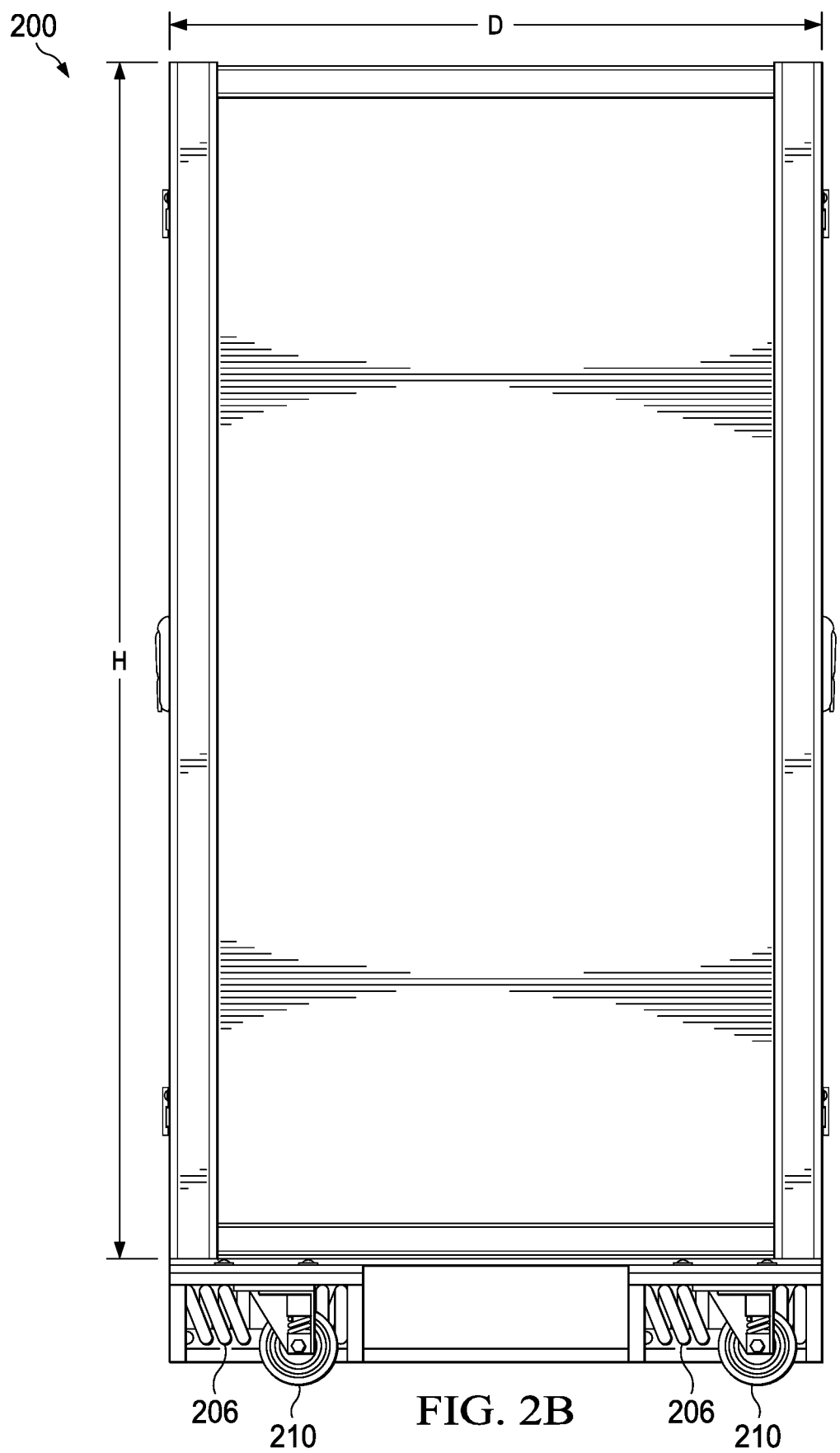
FIG. 2B illustrates a side view of the embodiment of FIG. 2A.
Figure 2C:
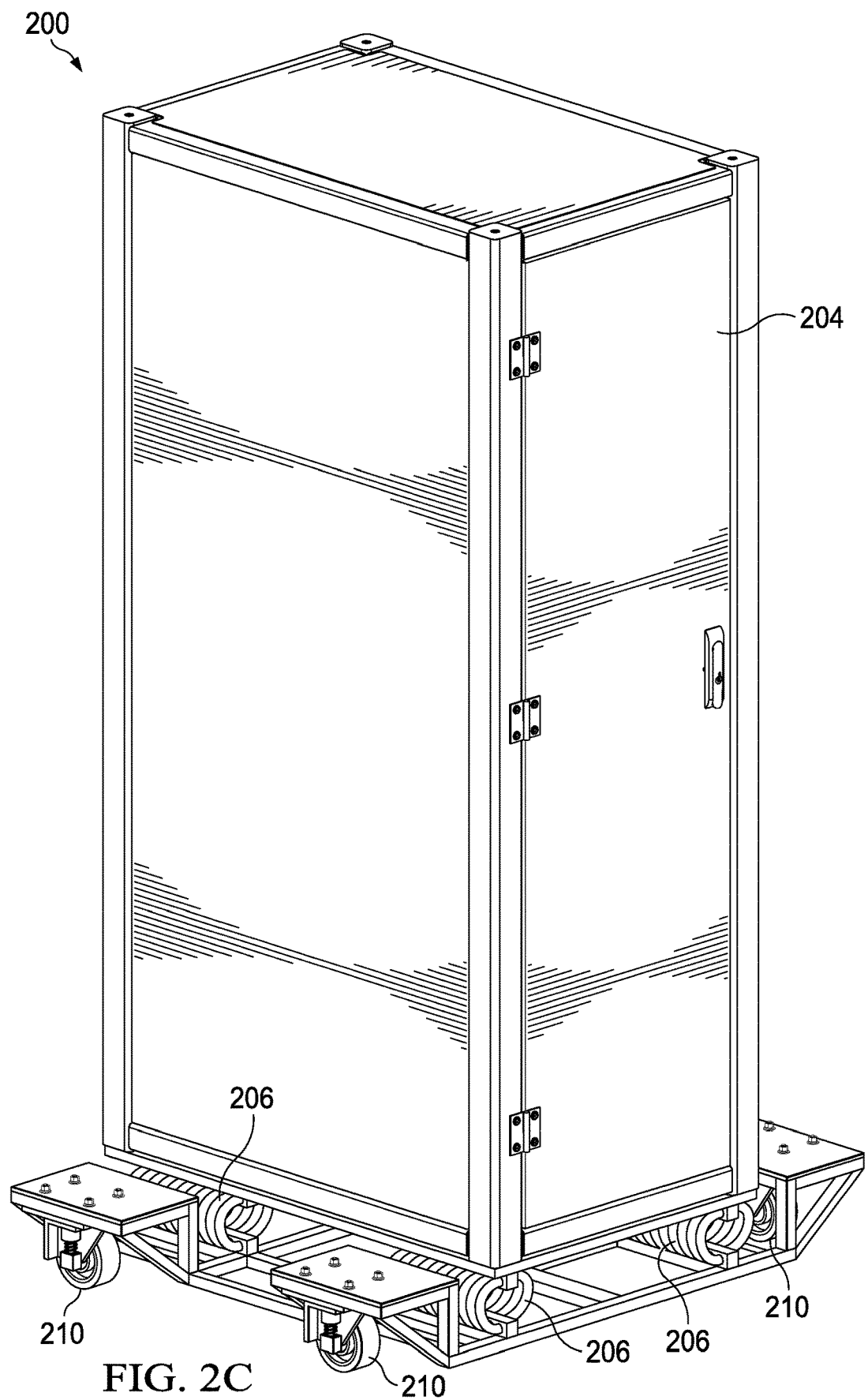
FIG. 2C illustrates a perspective view of the embodiment of FIG. 2A.

Turning now to FIGS. 2A-2C, several views are shown of an example tote 200. Tote 200 includes an enclosure portion 202 coupled on top of a base portion 208. Enclosure portion 202 may include a door 204 and a rack (not explicitly shown in these views) for receiving a plurality of information handling systems such as information handling system 102. In some embodiments, the rack may be manufactured according to a standard such as EIA-310, which defines standard rack unit sizing. For example, the embodiment shown at tote 200 may be sized to accommodate 40 rack units worth of information handling systems. In other embodiments, different sizes may be used such as 21-inch server equipment, laptops, desktops, other types of information handling systems, or information handling resources such as internet-of-things (IOT) hardware, hard drives, monitors, etc.

In some embodiments, tote 200 may be usable only for transport of information handling systems (e.g., it may not be configured for powering and operating such systems while they are received in the rack).

The rack may be isolated from vibrations during transit via the use of isolators 206. In various embodiments, isolators 206 may be wire rope, elastomeric, or any other suitable type of isolator. In the embodiment shown, isolators 206 are of the wire rope type. In some embodiments, tote 200 may also include lateral shock absorbers for protection from bumps that it may experience during integration and transportation (e.g., running into other racks, walls, truck walls, etc.).

Base portion 208 may also include casters 210 (e.g., four casters 210), which may be installed in an "outrigger" configuration. For example, enclosure portion 202 has a height H, a width W, and a depth D as shown. The width and the depth may define a footprint for enclosure portion 202, and casters 210 may be disposed in positions that are laterally displaced such that they reside outside of the footprint of enclosure portion 202. In the embodiment shown, casters 210 may be shock-absorbing casters. For example, they may have integral shock dampers and/or may be mounted on shock-damping mounts.

The outrigger configuration for casters 210 may provide additional stability, when compared to a configuration in which casters 210 are within the footprint of enclosure portion 202 (e.g., below enclosure portion 202). Further, the displacement of casters 210 along the width direction but not along the depth direction may allow for the total depth of tote 200 may be minimized, allowing for movement through narrow doors, elevators, etc. Further, the need for pallet jacks may be eliminated.

The configuration of casters 210 and isolators 206 shown may further allow tote 200 to have a reduced total height, easing travel in constrained spaces.

Figure 3A:
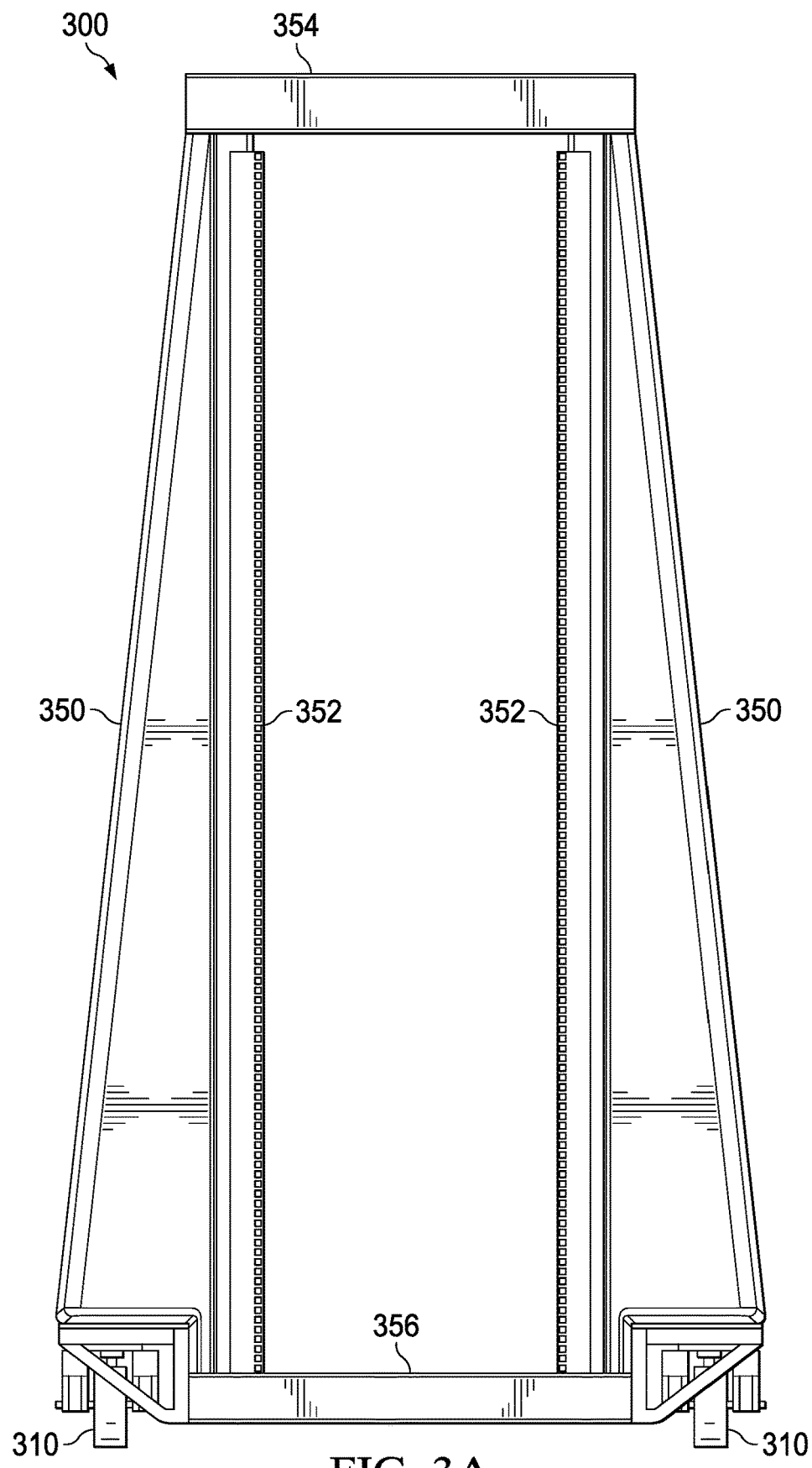
FIG. 3A illustrates a front view of an example transportation apparatus, in accordance with embodiments of the present disclosure.
Figure 3B:
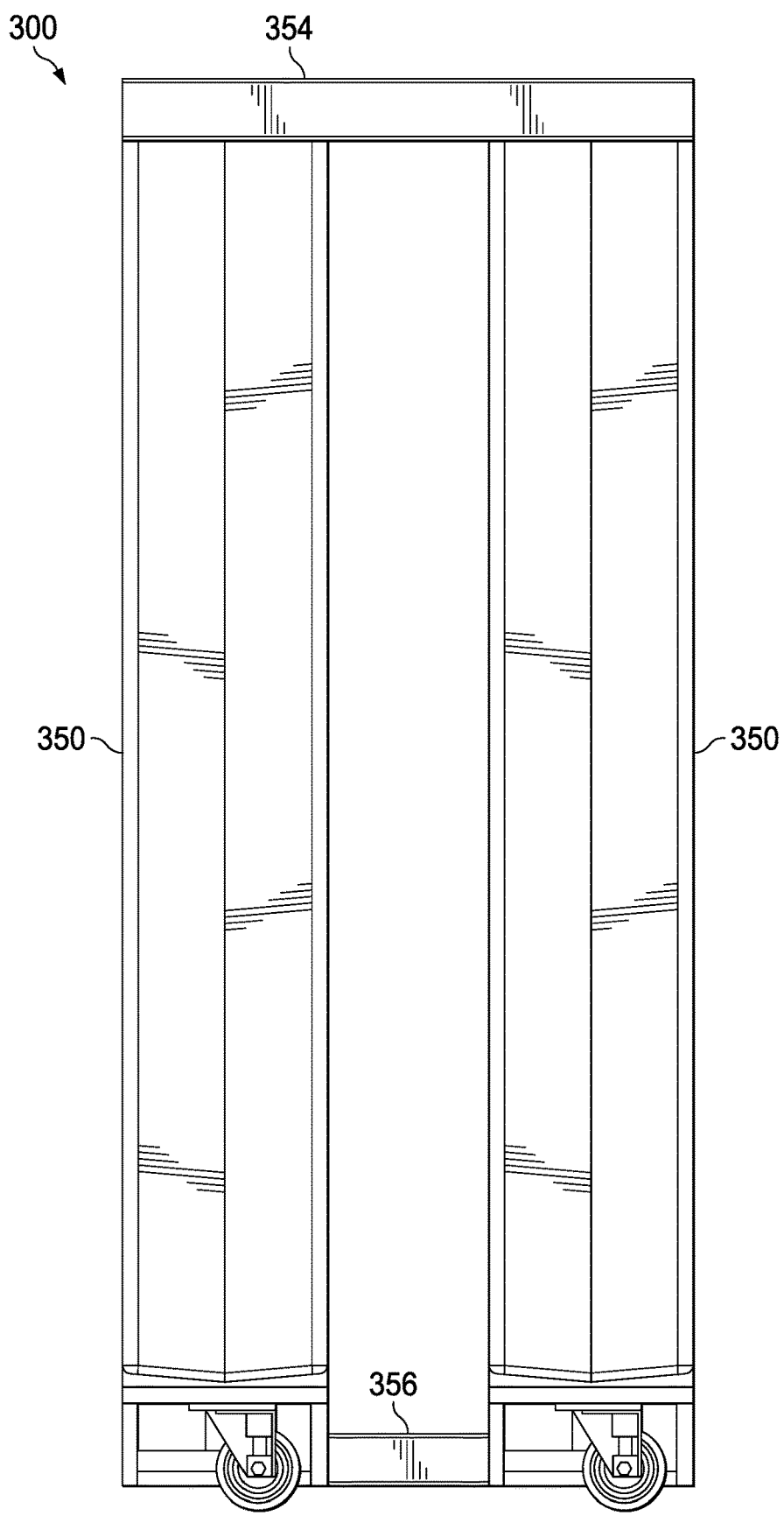
FIG. 3B illustrates a side view of the embodiment of FIG. 3A.
Figure 3C:
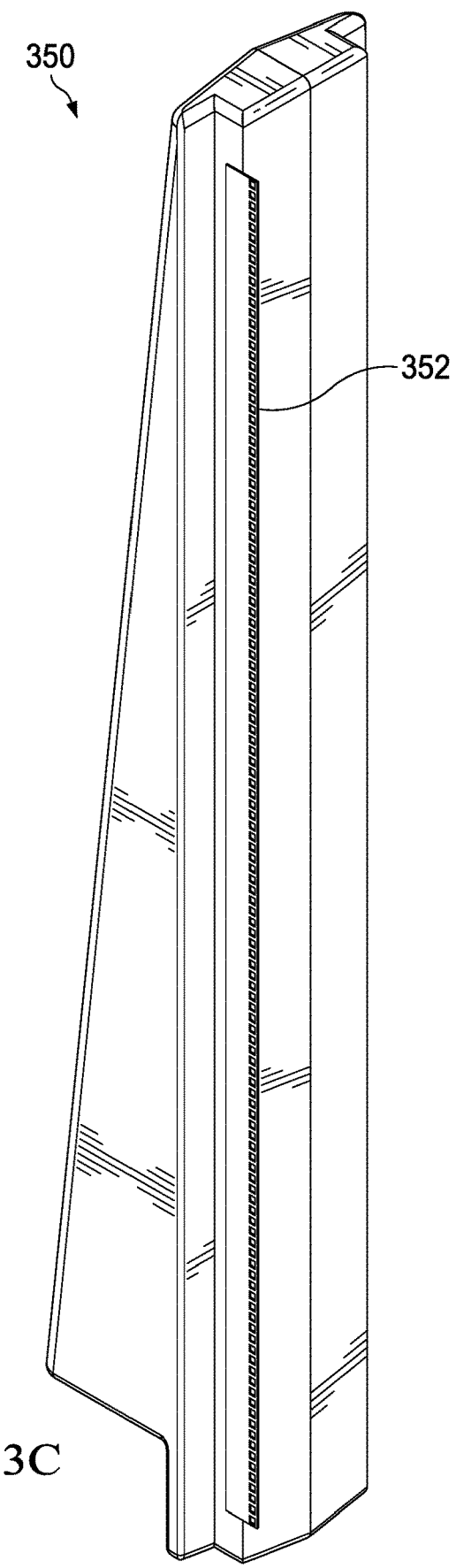
FIG. 3C illustrates a perspective view of a portion of the embodiment of FIG. 3A.

FIGS. 3A-3C show elements of an embodiment of tote 300, generally similar to tote 200, but in which the side walls of tote 200 have been replaced with one or more plastic elements. FIG. 3A shows a front view of tote 300; FIG. 3B shows a side view of tote 300; and FIG. 3C shows a detail perspective view of a plastic post 350. As in tote 200, tote 300 may include casters 310, other shock and/or vibration absorbing elements, etc.

For the sake of clarity and exposition, the front and rear doors/panels, as well as some other elements, have been omitted in the drawings of tote 300. Features in FIGS. 3A-3C that are similar to the corresponding features in FIGS. 2A-2C will not be discussed in detail, with the discussion focusing instead mostly on the differences.

As shown in the embodiment of FIG. 3A and FIG. 3B, four plastic posts 350 have been molded and used to construct the side walls of tote 300. Mounting features 352 may be used to receive and retain information handling systems. For example, mounting features 352 may include shelves, EIA rack mounting hardware, etc.

In embodiments in which mounting features 352 include features that are compliant with a standard such as EIA-310, some additional constraints may be applicable. For example, the plane attaching the left and right EIA flanges may need to be coplanar, and the front and back flanges may need to be parallel. In some embodiments (e.g., using injection molding) this planar face may be treated as the base plane, and all of the other walls may be drafted relative to it in order to aid in removal of the molded plastic from the molding cavity.

In some embodiments, mounting features 352 for information handling systems may be molded into the surface of plastic posts 350. In other embodiments, one or more fasteners may be molded into plastic posts 350, and mounting features 352 may be bolted to such fasteners. In some cases, mounting features 352 may include front rails for fastening to the front of information handling systems. In some embodiments, mounting features 352 may further include rear rails for fastening to the rear of information handling systems, but such rear rails may also be omitted in other embodiments.

Generally speaking, a central vertical axis of tote 300 may be defined by mounting features 352. That is, when information handling systems are received in tote 300, they may be arranged in a "stacked" vertical orientation along such a central vertical axis.

Base 356 and top cover 354 may in some embodiments be coupled to plastic posts 350 and may maintain plastic posts 350 in a desired orientation (e.g., aligned along the vertical axis mentioned above).

In the embodiment shown in FIGS. 3A and 3B, four plastic posts 350 are used (e.g., two per side). In other embodiments, two plastic posts 350 may be used (e.g., one per side, such that only one wide plastic post 350 would be visible in the view depicted in FIG. 3B). In other embodiments, a single plastic element may be molded to comprise the entirety of the side walls of tote 300. In these and other embodiments, top cover 354, or base 356, or both, may also be combined with such a plastic molding into a single structural element. In yet other embodiments, any desired number of plastic posts 350 may be used. Generally speaking, the totality of plastic posts 350 may form a plastic frame of tote 300.

In some embodiments, additional features may be included in such a molding and/or moldings. For example, in addition to plastic posts 350, the molding may include door hinges, environmental sealing faces, drawers, latch catches, etc. The use of a molded plastic structure provides many benefits, and it may be even more beneficial in embodiments which combine many traditional parts into a single piece.

As shown in FIG. 3A, the external walls of tote 300 defined by plastic posts 350 may be non-vertical in some embodiments. In the embodiment shown, the external walls may be angled such that a bottom portion of the external walls is disposed at a greater distance from the central vertical axis of tote 300 than a top portion of the external walls is. Thus in the embodiment shown, all or a portion of casters 310 may be overhung by all or a portion of plastic posts 350.

FIG. 3C shows a perspective view of an embodiment of a plastic post 350. As shown, a mounting feature 352 (in this case, a rail) is coupled to the body of plastic post 350. Mounting feature 352 may be made of steel or any other suitable material. In other embodiments, mounting features 352 may include shelves for supporting information handling systems, and such shelves may be molded into the surface of plastic post 350.

Although various possible advantages with respect to embodiments of this disclosure have been described, one of ordinary skill in the art with the benefit of this disclosure will understand that in any particular embodiment, not all of such advantages may be applicable. In any particular embodiment, some, all, or even none of the listed advantages may apply.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

Further, reciting in the appended claims that a structure is "configured to" or "operable to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke § 112(f) during prosecution, Applicant will recite claim elements using the "means for [performing a function]" construct.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. An apparatus comprising:
   a plastic frame having an interior width and an interior depth defining an interior footprint of the plastic frame;
   a plurality of mounting features coupled to the plastic frame such that the plastic frame is configured to maintain the plurality of mounting features in a desired orientation, wherein the plurality of mounting features, when in the desired orientation, are operable to receive and retain information handling systems;
   a base coupled to the plastic frame and disposed below the plastic frame along a central vertical axis of the apparatus that is defined by the orientation of the plurality of mounting features, wherein the base is coupled to the plastic frame via at least one vibration damper, wherein the at least one vibration damper is a wire rope isolator, and wherein the plastic frame comprises a plurality of external walls that are angled relative to the vertical axis such that a bottom portion of the external walls is disposed at a greater distance from the central vertical axis than a top portion of the external walls; and
   a plurality of casters coupled to a bottom surface of the base in an outrigger configuration such that the casters are laterally disposed in positions that are outside the interior width of the plastic frame but beneath the bottom portion of the external walls.

2. The apparatus of claim 1, wherein the plastic frame comprises a plurality of plastic posts.

3. The apparatus of claim 2, further comprising a top cover disposed above the plastic frame along the central vertical axis.

4. The apparatus of claim 3, wherein the top cover is coupled to the plurality of plastic posts and configured to maintain the plurality of plastic posts in a vertical orientation along the central vertical axis.

5. The apparatus of claim 1, wherein the plastic frame comprises at least one plastic selected from the group consisting of injection-molded plastic, roto-molded plastic, and blow-molded plastic.

6. The apparatus of claim 1, wherein the plastic frame is formed from at least one plastic sheet.

7. The apparatus of claim 1, wherein the plurality of mounting features includes a plurality of mounting rails.

8. The apparatus of claim 7, wherein the plurality of mounting rails are coupled to a plurality of fasteners that are molded into the plastic frame.

9. The apparatus of claim 1, wherein the plurality of mounting features include a plurality of shelves configured to support the information handling systems.

10. The apparatus of claim 9, wherein the shelves are plastic shelves that are formed as portions of the plastic frame.

11. The apparatus of claim 1, wherein the plastic frame and the mounting features are sized to receive information handling systems that conform to standardized rack unit sizes.

12. The apparatus of claim 1, further comprising a door at a front of the plastic frame, wherein the information handling systems are insertable via the door.

13. The apparatus of claim 1, wherein the apparatus is reusable such that, without the use of any single-use materials:

the apparatus is configured to have loaded therein a plurality of information handling systems, be transported from a first location to a second location, and have the plurality of information handling systems be unloaded therefrom.

14. The apparatus of claim 1, wherein the apparatus is configured for transportation of the information handling systems, but is not configured to allow for operation of the information handling systems while the information handling systems are received therein.

15. A method comprising:
forming a plastic frame of an apparatus, the plastic frame having an interior width and an interior depth defining an interior footprint of the plastic frame;
coupling a plurality of mounting features to the plastic frame such that the plastic frame is configured to maintain the plurality of mounting features in a desired orientation, wherein the plurality of mounting features, when in the desired orientation, are operable to receive and retain information handling systems;
coupling a base to the plastic frame below the plastic frame along a central vertical axis of the apparatus that is defined by the orientation of the plurality of mounting features, wherein the base is coupled to the plastic frame via at least one vibration damper, wherein the at least one vibration damper is a wire rope isolator, and wherein the plastic frame comprises a plurality of external walls that are angled relative to the vertical axis such that a bottom portion of the external walls is disposed at a greater distance from the central vertical axis than a top portion of the external walls; and
coupling a plurality of casters to a bottom surface of the base in an outrigger configuration such that the casters are laterally disposed in positions that are outside the interior width of the plastic frame but beneath the bottom portion of the external walls.

16. The method of claim 15, wherein the forming the plastic frame includes molding the plastic frame from a thermoplastic material.

17. The method of claim 15, further comprising:
loading a plurality of information handling systems into the apparatus;
transporting the apparatus from a first location to a second location;
unloading the plurality of information handling systems from the apparatus; and
reusing the apparatus by loading a second, different plurality of information handling systems into the apparatus.

* * * * *